(12) United States Patent
Naumann et al.

(10) Patent No.: US 9,318,345 B2
(45) Date of Patent: Apr. 19, 2016

(54) ENHANCING TRANSISTOR PERFORMANCE BY REDUCING EXPOSURE TO OXYGEN PLASMA IN A DUAL STRESS LINER APPROACH

(75) Inventors: Ronald Naumann, Dresden (DE); Volker Grimm, Langebrueck (DE); Andrey Zakharov, Dresden (DE); Ralf Richter, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 616 days.

(21) Appl. No.: 13/253,210

(22) Filed: Oct. 5, 2011

(65) Prior Publication Data

US 2013/0089985 A1 Apr. 11, 2013

(51) Int. Cl.
| | |
|---|---|
| *H01L 21/31* | (2006.01) |
| *H01L 21/311* | (2006.01) |
| *H01L 21/8238* | (2006.01) |
| *H01L 21/02* | (2006.01) |
| *H01L 29/78* | (2006.01) |

(52) U.S. Cl.
CPC ...... *H01L 21/31138* (2013.01); *H01L 21/0206* (2013.01); *H01L 21/823807* (2013.01); *H01L 29/7848* (2013.01)

(58) Field of Classification Search
CPC .................... H01L 21/823807; H01L 29/7843
USPC .................................................. 438/703, 694
See application file for complete search history.

(56) References Cited

U.S. PATENT DOCUMENTS

| | | | |
|---|---|---|---|
| 6,647,994 B1 | 11/2003 | Lui et al. | |
| 7,867,917 B2 * | 1/2011 | Hohage et al. ............... | 438/775 |
| 7,871,941 B2 * | 1/2011 | Frohberg et al. .............. | 438/783 |
| 8,105,962 B2 * | 1/2012 | Frohberg et al. .............. | 438/783 |
| 8,154,084 B2 * | 4/2012 | Hoentschel ....... H01L 21/26506 | 257/369 |
| 2002/0192885 A1 * | 12/2002 | Miyasaka ......... H01L 29/66757 | 438/164 |
| 2008/0081481 A1 * | 4/2008 | Frohberg et al. .............. | 438/704 |
| 2008/0280404 A1 * | 11/2008 | Chudzik ........... H01L 21/28079 | 438/199 |
| 2009/0140348 A1 * | 6/2009 | Frohberg ........ H01L 21/823412 | 257/369 |
| 2009/0325388 A1 * | 12/2009 | Ono et al. ...................... | 438/712 |
| 2010/0075476 A1 * | 3/2010 | Miyashita ..................... | 438/229 |
| 2011/0237085 A1 * | 9/2011 | Schmitt et al. ................ | 438/763 |
| 2011/0244670 A1 * | 10/2011 | Richter et al. ................ | 438/585 |
| 2011/0269266 A1 * | 11/2011 | Yamazaki ..................... | 438/104 |
| 2012/0156839 A1 * | 6/2012 | Scheiper et al. .............. | 438/229 |
| 2012/0253497 A1 * | 10/2012 | Prager ............... H01J 37/32082 | 700/104 |

FOREIGN PATENT DOCUMENTS

DE 40 37 444 A1 7/1992

OTHER PUBLICATIONS

Translation of Official Communication from German Patent Application No. 10 2011 090 166.3 dated Jun. 1, 2012.

* cited by examiner

*Primary Examiner* — Jerome Jackson, Jr.
*Assistant Examiner* — Damian A Hillman
(74) *Attorney, Agent, or Firm* — Amerson Law Firm, PLLC

(57) ABSTRACT

When forming strain-inducing dielectric material layers above transistors of different conductivity type, the patterning of at least one strain-inducing dielectric material may be accomplished on the basis of a process sequence in which a negative influence of a fluorine species in an oxygen plasma upon removing the resist mask is avoided or at least significantly suppressed. For example, a substantially oxygen-free plasma process may be applied for removing the resist material.

24 Claims, 11 Drawing Sheets

ENHANCING TRANSISTOR PERFORMANCE BY REDUCING EXPOSURE TO OXYGEN PLASMA IN A DUAL STRESS LINER APPROACH

BACKGROUND OF THE INVENTION

1. Field of the Invention

Generally, the present disclosure relates to the field of integrated circuits, and, more particularly, to the manufacturing of field effect transistors having a strained channel region caused by a stressed dielectric material formed above the transistor.

2. Description of the Related Art

Integrated circuits typically comprise a large number of circuit elements on a given chip area according to a specified circuit layout, wherein, in complex circuits, the field effect transistor represents one important device component. Generally, a plurality of process technologies are currently practiced, wherein, for complex circuitry based on field effect transistors, such as microprocessors, storage chips and the like, MOS technology is currently one of the most promising approaches due to the superior characteristics in view of operating speed and/or power consumption and/or cost efficiency. During the fabrication of complex integrated circuits using CMOS technology, millions of complementary transistors, i.e., N-channel transistors and P-channel transistors, are formed on a substrate including a crystalline semiconductor layer. A field effect transistor, irrespective of whether an N-channel transistor or a P-channel transistor is considered, comprises so-called PN junctions that are formed by an interface of highly doped drain and source regions with an inversely or weakly doped channel region disposed between the drain region and the source region. The conductivity of the channel region, i.e., the drive current capability of the conductive channel, is controlled by a gate electrode formed above the channel region and separated therefrom by a thin insulating layer. The conductivity of the channel region, upon formation of a conductive channel due to the application of an appropriate control voltage to the gate electrode, depends on, among other things, the dopant concentration, the mobility of the charge carriers and, for a given extension of the channel region in the transistor width direction, on the distance between the source and drain regions, which is also referred to as channel length. Hence, the conductivity of the channel region represents an important factor that substantially affects the performance of the MOS transistors. Thus, the reduction of the channel length, and associated therewith the reduction of the channel resistivity, may be dominant design criteria for accomplishing an increase in the operating speed of integrated circuits.

The shrinkage of the transistor dimensions, however, involves a plurality of issues associated therewith that have to be addressed so as to not unduly offset the advantages obtained by steadily decreasing the channel length of MOS transistors. One problem in this respect is the reduction of the thickness of the gate dielectric layer in order to maintain the desired channel controllability on the basis of increased capacitive coupling. With the thickness of oxide-based gate dielectrics approaching 1.5 nm and less, the further scaling of the channel length may be difficult due to an unacceptable increase of leakage currents through the gate dielectric. For this reason, it has been proposed to enhance device performance of the transistor elements not only by reducing the transistor dimensions but also by increasing the charge carrier mobility in the channel region for a given channel length. One efficient approach in this respect is the modification of the lattice structure in the channel region, for instance by creating tensile or compressive strain therein, which results in a modified mobility for electrons and holes, respectively. For example, creating tensile strain in the channel region of a silicon layer having a standard crystallographic configuration may increase the mobility of electrons, which in turn may directly translate into a corresponding increase in the conductivity for N-type transistors. On the other hand, compressive strain in the channel region may increase the mobility of holes, thereby providing the potential for enhancing the performance of P-type transistors. Consequently, it has been proposed to introduce, for instance, a silicon/germanium layer or a silicon/carbon layer near the channel region so as to create tensile or compressive stress. In this manner, transistor performance may be considerably enhanced by the introduction of strain-creating materials in the drain and source areas, in particular for P-channel transistors, as, for instance, a silicon/germanium alloy embedded in the drain and source areas has proven to be a very efficient strain-inducing source. To this end, additional epitaxial growth techniques have to be developed and implemented into the process flow so as to form the germanium-containing material.

In other approaches, additionally or alternatively to the above-described concept, a technique is frequently used that enables the creation of desired stress conditions within the channel region of different transistor elements by modifying the stress characteristics of a material that is closely positioned to the transistor structure in order to allow an efficient stress transfer to the channel region. For example, the spacer typically provided at sidewalls of the gate electrodes and the contact etch stop layer that is formed above the basic transistor structure are promising candidates for creating external stress, which may then be transferred into the transistor. The contact etch stop layer is, therefore, frequently used since it may be required anyway for controlling an etch process designed to form contact openings to the gate, drain and source terminals in an interlayer dielectric material. The effective control of mechanical stress in the channel region, i.e., an effective stress engineering, may be accomplished for different types of transistors by individually adjusting the internal stress in the contact etch stop layers located above the respective transistor elements so as to position a contact etch stop layer having an internal compressive stress above a P-channel transistor while positioning a contact etch stop layer having an internal tensile strain above an N-channel transistor, thereby creating compressive and tensile strain, respectively, in the respective channel regions.

Typically, the contact etch stop layer is formed by plasma enhanced chemical vapor deposition (PECVD) processes above the transistor, i.e., above the gate structure and the drain and source regions, wherein, for instance, silicon nitride may be used due to its high etch selectivity with respect to silicon dioxide, which is a well-established interlayer dielectric material. Furthermore, PECVD silicon nitride may be deposited with a high intrinsic stress, for example, up to 3 Giga Pascal (GPa) or significantly higher of compressive stress, while stress levels of 1 GPa and higher may be obtained for tensile-stressed silicon nitride materials. The type and the magnitude of the intrinsic stress may be efficiently adjusted by selecting appropriate deposition parameters and selecting appropriate post-deposition treatments based on ultraviolet (UV) treatments, wherein generally process temperatures during deposition and post-deposition treatments are adjusted to 500° C. or less so as to not unduly affect other materials, such as a metal silicide that is typically formed in the drain and source regions prior to forming the stressed silicon nitride material.

As explained before, the contact etch stop layer is positioned close to the transistor so that the intrinsic stress may be efficiently transferred into the channel region, thereby significantly improving the performance thereof. Moreover, for advanced applications, the strain-inducing contact etch stop layer may be efficiently combined with other strain-inducing mechanisms, such as strained or relaxed semiconductor materials that are incorporated at appropriate transistor areas in order to also create a desired strain in the channel region. Consequently, the stressed contact etch stop layer is a well-established design feature for advanced semiconductor devices.

In actual integration schemes for selectively providing a tensile-stressed dielectric material and a compressively-stressed dielectric material above respective transistor elements, which is also referred to as a dual stress liner approach, it may be observed, however, that performance of the transistors is not enhanced as efficiently as expected.

With reference to FIGS. 1a-1f, an integration scheme will now be described in more detail in which a typical dual stress liner approach is applied.

FIG. 1a schematically illustrates a cross-sectional view of a semiconductor device 100 comprising a substrate 101, above which is provided a semiconductor layer 102, such as a silicon-based semiconductor material whose electronic characteristics are to be enhanced by locally introducing a desired type of strain, as discussed above. The semiconductor layer 102 is laterally divided into a plurality of active regions, which are to be understood as semiconductor regions of the layer 102, in and above which corresponding transistors are to be formed. In the example shown, the first active region 102a is laterally separated from a second active region 102b by an isolation region 102c, which may be provided in the form of a shallow trench isolation. In the example shown, the active region 102a corresponds to an N-channel transistor 150a, while the active region 102b has formed therein and thereon a P-channel transistor 150b. The transistors 150a, 150b comprise gate electrode structures 160, which may have basically the same configuration and which may comprise a gate dielectric material 161 and an electrode material 162, which typically includes a semiconductor material, such as silicon. Usually, the overall conductivity of the gate electrode structures 160 is increased by providing a metal silicide 163 on and within the semiconductor material 162. Furthermore, a spacer structure 164 is provided on sidewalls, which may be used for appropriately defining the lateral and vertical profile drain and source regions 152 and the lateral offset of metal silicide regions 153. Consequently, in a further advanced manufacturing stage, an appropriate strain-inducing mechanism is to be implemented so as to create a desired type of strain, i.e., a tensile strain, in a channel region 151 of the transistor 150a. Similarly, an appropriate strain-inducing mechanism is to be implemented for the transistor 150b so as to induce a compressive strain in the active region 102b. In some advanced approaches, the transistor 150b may comprise an additional strain-inducing mechanism in the form of an embedded silicon/germanium material 154, which is provided in a strained state, thereby also inducing a high compressive strain in the channel region of the transistor 150b. Furthermore, in this manufacturing stage, a thin etch stop layer 111, for instance in the form of a silicon dioxide material, may be formed above the transistors 150a, 150b in order to reduce degradation of sensitive materials of the transistors 150a, 150b upon depositing a highly stressed dielectric material and patterning the same, as will be described later on in more detail. In other strategies (not shown), the etch stop layer 111 may be omitted in order to enhance the overall stress transfer efficiency of a stressed dielectric material still to be formed.

The semiconductor device 100 as illustrated in FIG. 1a may be formed on the basis of the following processes. The active regions 102a, 102b may be formed by appropriately patterning the semiconductor layer 102 and forming the isolation region 102c, followed by the incorporation of appropriate dopant species for adjusting the basic transistor characteristic of the P-channel transistor 150b and the N-channel transistor 150a. To this end, well-established implantation techniques and masking steps are applied. Thereafter, the gate electrode structures 160 are formed, for instance, by depositing appropriate materials for the layers 161 and 162 and subsequently patterning these materials, possibly by providing appropriate hard mask materials and the like, depending on the overall configuration of the gate electrode structures 160 and the patterning strategy to be applied. In sophisticated applications, a length of the gate electrode structures 160, i.e., in FIG. 1a the horizontal extension of the electrode material 162, is approximately 50 nm and less. Next, drain and source dopant species may be incorporated into the active regions 102a, 102b while forming the spacer structure 164, which may act as an appropriate implantation mask in order to obtain a desired lateral and vertical profile for the regions 152. In some cases, when the strain-inducing semiconductor material 154 is to be incorporated into the active region 102b, an appropriate process sequence is applied after patterning the gate electrode structures 160 and prior to forming the spacer structure 164. To this end, cavities may be etched into the active region 102b while covering the active region 102a and subsequently the material 154 may be grown in the cavities on the basis of selective epitaxial growth techniques. Thereafter, the drain and source regions 152 and the spacer structure 164 may be formed as required. After any high temperature processes, typically the metal silicide materials 153, 163 are formed by applying well-established silicidation techniques, wherein a refractory metal is deposited and treated so as to be converted into a metal silicide. For example, frequently nickel, possibly in combination with a certain amount of platinum, is used as the refractory metal, thereby obtaining a highly conductive metal silicide. Next, if required, the etch stop layer 111 may be deposited by any well-established deposition technique.

FIG. 1b schematically illustrates the semiconductor device 100 in a further advanced manufacturing stage. As shown, a strain-inducing dielectric layer 112a, for instance provided in the form of a silicon nitride material, is formed above the transistors 150a, 150b and thus induces a tensile strain component in the active regions 102a, 102b. Furthermore, in the example shown, an additional etch control layer 113, for instance provided in the form of a silicon dioxide material, is formed on the strain-inducing layer 112a which may be used in a later manufacturing stage upon patterning a further strain-inducing dielectric material still to be formed. Moreover, since the type of internal stress of the layer 112a is inappropriate for the transistor 150b, a resist mask 114 is typically provided so as to enable the removal of an unwanted portion of the layer 112a in a subsequent etch sequence.

The layer 112a may be formed on the basis of well-established PECVD techniques in which, as discussed above, process parameters, such as ion bombardment, pressure, composition of precursor gases and the like, are appropriately selected so as to deposit the material with a high internal stress level. Furthermore, after deposition of the base material of the layer 112a, further treatment may be performed, for instance by using UV radiation and the like, thereby even further enhancing or generally adjusting the desired magnitude of the internal stress level in the layer 112a. In this manner, a tensile stress level of up to 1.8 GPa or even higher may be achieved, while process temperatures may be maintained at or below 500° C., thereby avoiding significant modifications of sensitive materials, such as the nickel silicide 153, 163 and the like. If required, the layer 113 may be deposited, for instance prior to or after any additional treatment of the material 112a, by applying any appropriate deposition technique and the like. Finally, a lithography process may be applied in order to form the resist mask 114 by using well-established strategies.

FIG. 1c schematically illustrates the device 100 in a process environment 120, which is appropriately configured so as to perform a plasma-based etch process 121a. Typically, the environment 120 may be provided in the form of an etch chamber in which an appropriate plasma may be established, for instance a transformer coupled plasma etch chamber (TCP) is used due to the superior plasma uniformity and the like. The plasma is typically established on the basis of oxygen, gas and a gas $C_xH_yF_z$, which thus provides appropriate radicals in order to efficiently remove material of the layer 112a, while a certain degree of selectivity to silicon dioxide may be achieved, thereby enabling a certain control of the etch process 121a. During the process 121a, typically a certain amount of the material of the resist mask 114 is also consumed, thereby also creating respective etch byproducts, such as carbon and fluorine-containing polymers, which may deposit on the device 100 and also on hardware components of the process environment 120.

FIG. 1d schematically illustrates the device 100 in a further plasma assisted process 121b that is performed in the same process environment 120 in order to remove polymer residuals, such as the resist mask 114 and other etch byproducts, that may have deposited on the surface of the device 100 during the preceding plasma-based etch process 121a (FIG. 1c) in order to remove the exposed portion of the layer 112a. The plasma process 121b is typically performed on the basis of a substantially pure oxygen atmosphere, thereby achieving an efficient ashing of the organic materials of the device 100, such as the resist mask 114 and the like.

Typically, after removal from the process environment 120, the further processing is continued by performing a further cleaning process, possibly removing the residues of the etch stop layer 111 from above the transistor 150b, if this layer 111 is provided at all. To this end, wet chemical cleaning recipes may be applied.

FIG. 1e schematically illustrates the device 100 in a further advanced manufacturing stage. As shown, a further strain-inducing dielectric layer 112b is formed above the transistors 150a, 150b in order to introduce a desired strain in the transistor 150b, for instance in the form of a compressive strain, as discussed above. To this end, the layer 112b may be deposited on the basis of PECVD techniques, possibly in combination with additional radiation treatments and the like, so as to obtain a moderately high internal stress level in the material of the layer 112b. For example, a compressive stress level of 3.5 GPa and even higher may be accomplished on the basis of presently available deposition and treatment recipes for silicon nitride material. Moreover, in order to avoid undue effect of a compressive stress level in the layer 112b on the transistor 150a, i.e., on the previously provided tensile stressed dielectric layer 112a, in a dual stress liner approach, the layer 112b may be removed from above the transistor 150a, which is accomplished by providing a further resist mask 115 and performing a further etch sequence on the basis of similar process parameters as described above with reference to the plasma assisted processes 121a, 121b (FIGS. 1c, 1d).

FIG. 1f schematically illustrates the device 100 within the process environment 120 in a phase when the layer 112b is already removed from above the transistor 150a and the remaining portion of the resist mask 115 is removed, which may be accomplished on the basis of an oxygen plasma 121b, as described above. Consequently, during the process 121b, at least the material 112b is exposed to the oxygen plasma, thereby potentially modifying a surface area thereof. On the other hand, a certain interaction with the material 112a may occur during the oxygen plasma 121b, depending on whether layer 113 has been provided and on the thickness of the layer 113. Next, a further cleaning process is applied in which, if required, the layer 113 may also be removed, thereby preparing the surface of the device 100 for the deposition of an interlayer dielectric material. To this end, any well-established deposition recipes may be applied in order to form a silicon dioxide material having a desired thickness in accordance with the overall device requirements. Thereafter, the interlayer dielectric material is patterned so as to form openings therein, wherein the layers 112a, 112b act as efficient etch stop materials. Thereafter, the etch stop layers 112a, 112b are appropriately etched so as to increase a depth of the corresponding contact openings so as to connect to the materials 163 and 153, respectively. Thereafter, the contact openings are filled with high conductive material, thereby completing the contact level of the device 100.

Basically, the above-described dual stress liner approach is a very efficient mechanism for inducing a desired type of strain for N-channel transistors and P-channel transistors, wherein, however, the finally observed performance of these transistors may be significantly less compared to the expected gain in performance.

In view of the situation described above, the present disclosure relates to manufacturing techniques in which a strain-inducing material layer may be formed above a transistor so as to obtain superior overall transistor performance compared to conventional dual stress liner approaches.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure relates to techniques for implementing an efficient strain-inducing mechanism on the basis of a dielectric material formed above a transistor structure, wherein transistor performance may be enhanced more efficiently compared to conventional strategies since it has been recognized that, in particular, the combination of a plasma assisted etch process and an oxygen plasma may have a significant influence on the finally obtained transistor performance. Without intending to restrict the present application to the following explanation, it is assumed that the presence of a fluorine species upon performing an oxygen-based plasma process may have a pronounced effect on a silicon nitride material and also on sensitive materials, such as metal silicide materials, thereby resulting in a certain deterioration of material characteristics. For example, an oxygen plasma, as is typically applied for removing organic materials, may result in a certain degree of oxidation, for instance of a silicon nitride material, which may thus result in a significant stress relaxation, wherein, in particular, the additional presence of fluorine may further enhance the overall "efficiency" of the stress-relaxing effect. In other cases, a fluorine species may still be present in the process chamber after the actual silicon nitride etch process, for instance by releasing fluorine in an oxygen plasma from polymer residuals, which may have previously been created and deposited in the process environment, so that the fluorine species may interact with the sensitive device materials, such as the metal silicide surface, thereby breaking bonds in the metal silicide and thus significantly modifying the resulting structure of this material. Hence, a plurality of volatile fluorine-based compounds may be formed during this process phase, which in turn may result in significant material modification, in particular when additional species, such as germanium, are present in the silicide due to the incorporation of a silicon/germanium material in the form of a strain-inducing mechanism. Moreover, due to the interaction with the fluorine species, a pronounced interaction with oxygen radicals of the oxygen plasma may take place, thereby also significantly modifying, i.e., oxidizing, any exposed surface areas of sensitive materials, such as the metal silicide. Consequently, the present disclosure provides embodiments which are directed to reducing material deterioration upon patterning a strain-inducing dielectric material.

One illustrative method disclosed herein comprises forming a first strain-inducing dielectric layer above a first transistor and a second transistor. The method further comprises selectively removing a portion of the first strain-inducing layer from above the second transistor by covering the first transistor with a resist mask and performing a first plasma assisted etch process in a first process environment. Moreover, the method comprises removing the resist mask by performing a second plasma assisted process in a second process environment that is different from the first process environment.

A further illustrative method disclosed herein comprises forming a first strain-inducing dielectric layer above a first transistor and a second transistor. The method further comprises forming a resist mask above the first transistor so as to expose a portion of the first strain-inducing dielectric layer selectively above the second transistor. Additionally, the method comprises removing the exposed portion of the first strain-inducing dielectric layer in a first plasma ambient in the presence of the resist mask. The method further comprises removing the resist mask in a second plasma ambient without supplying oxygen gas to the second plasma ambient.

A still further illustrative embodiment disclosed herein comprises forming a first transistor in and above a first active region and a second transistor in and above a second active region, wherein the second active region comprises a strain-inducing semiconductor alloy. The method further comprises forming a strain-inducing layer above the first and second transistors. Additionally, a resist mask is formed so as to cover the strain-inducing layer above the first transistor and to expose the strain-inducing layer above the second transistor. The method further comprises removing an exposed portion of the strain-inducing layer by using a first plasma ambient based on fluorine radicals. Moreover, the method comprises removing the resist mask by establishing a second plasma ambient so as to adjust a reduced fluorine and oxygen concentration compared to the first plasma ambient.

BRIEF DESCRIPTION OF THE DRAWINGS

The disclosure may be understood by reference to the following description taken in conjunction with the accompanying drawings, in which like reference numerals identify like elements, and in which.

Figure 1A:
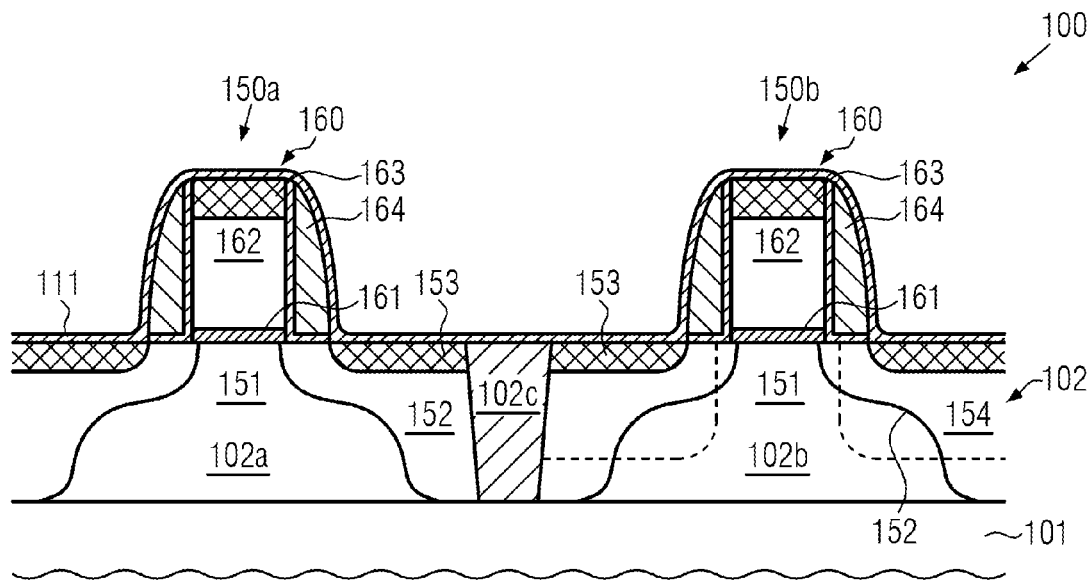
FIGS. 1a-1f schematically illustrate cross-sectional views of a semiconductor device during various manufacturing stages when applying a dual stress liner approach, according to conventional strategies.
Figure 1B:
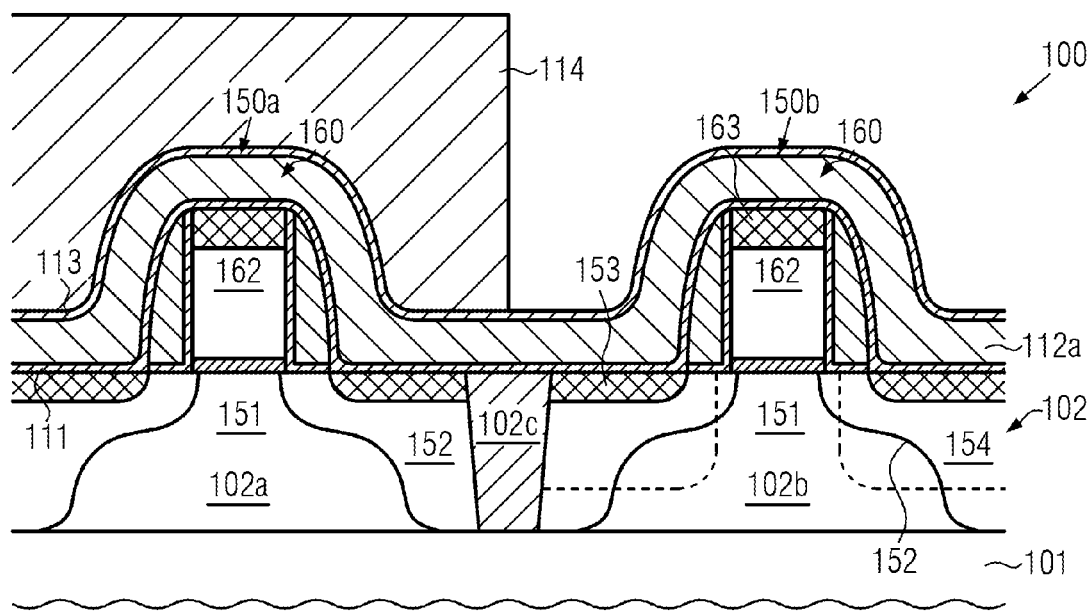
Figure 1C:
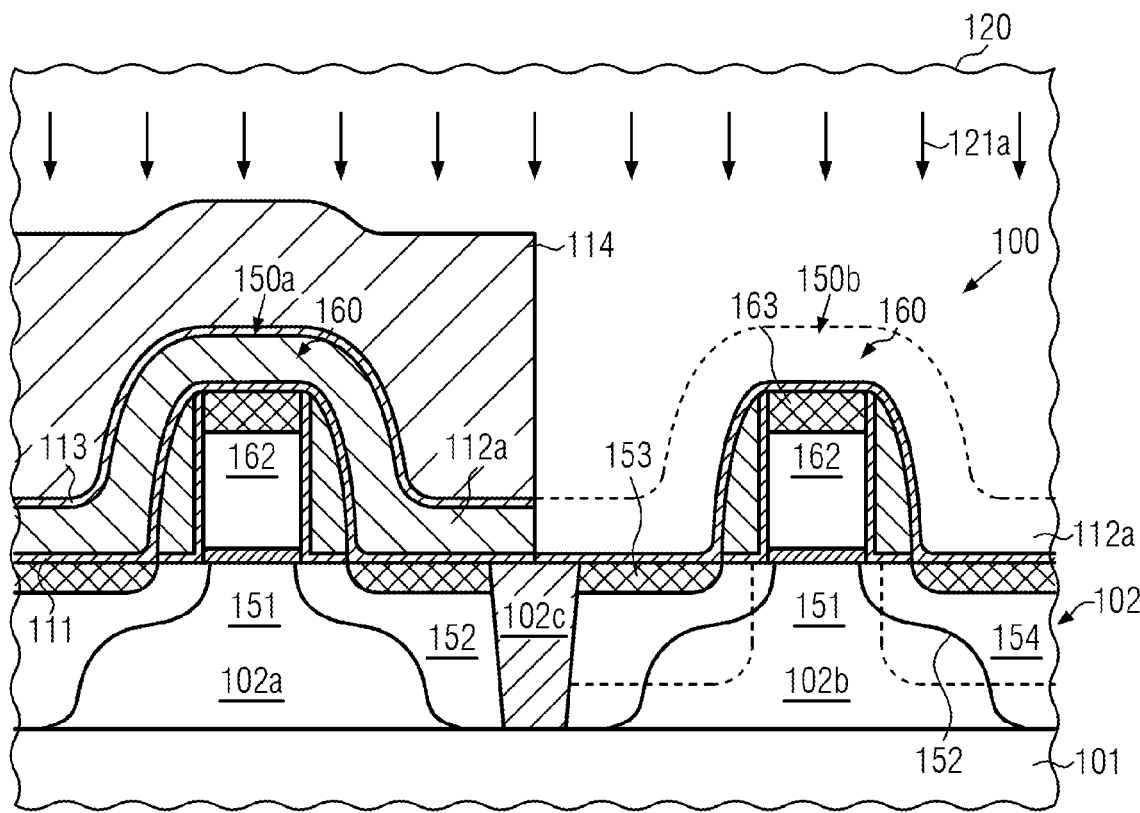
Figure 1D:
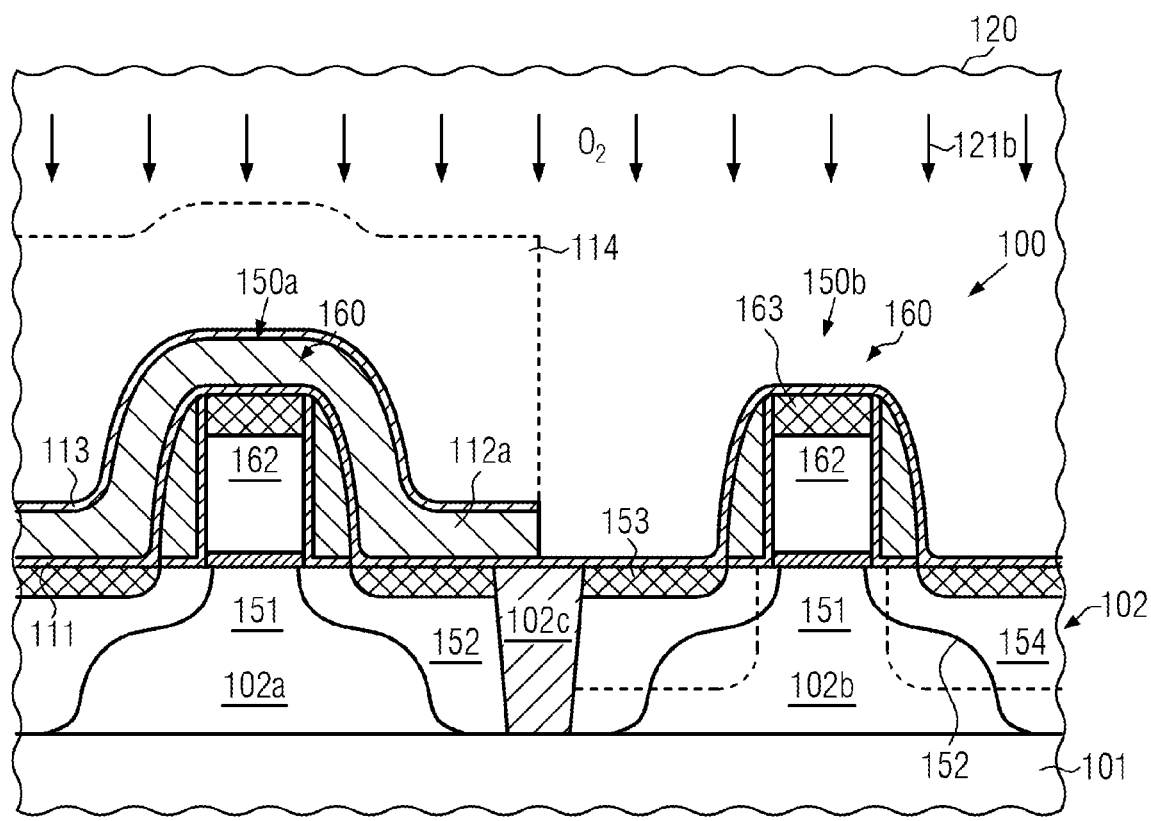
Figure 1E:
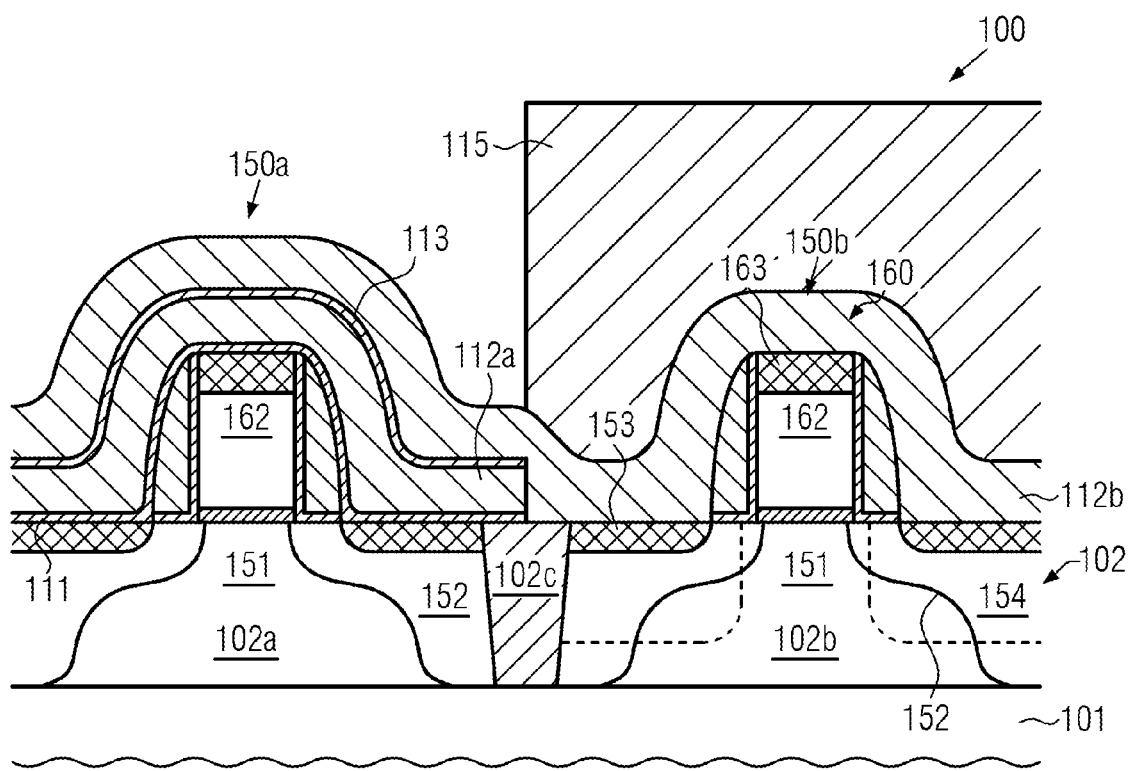
Figure 1F:
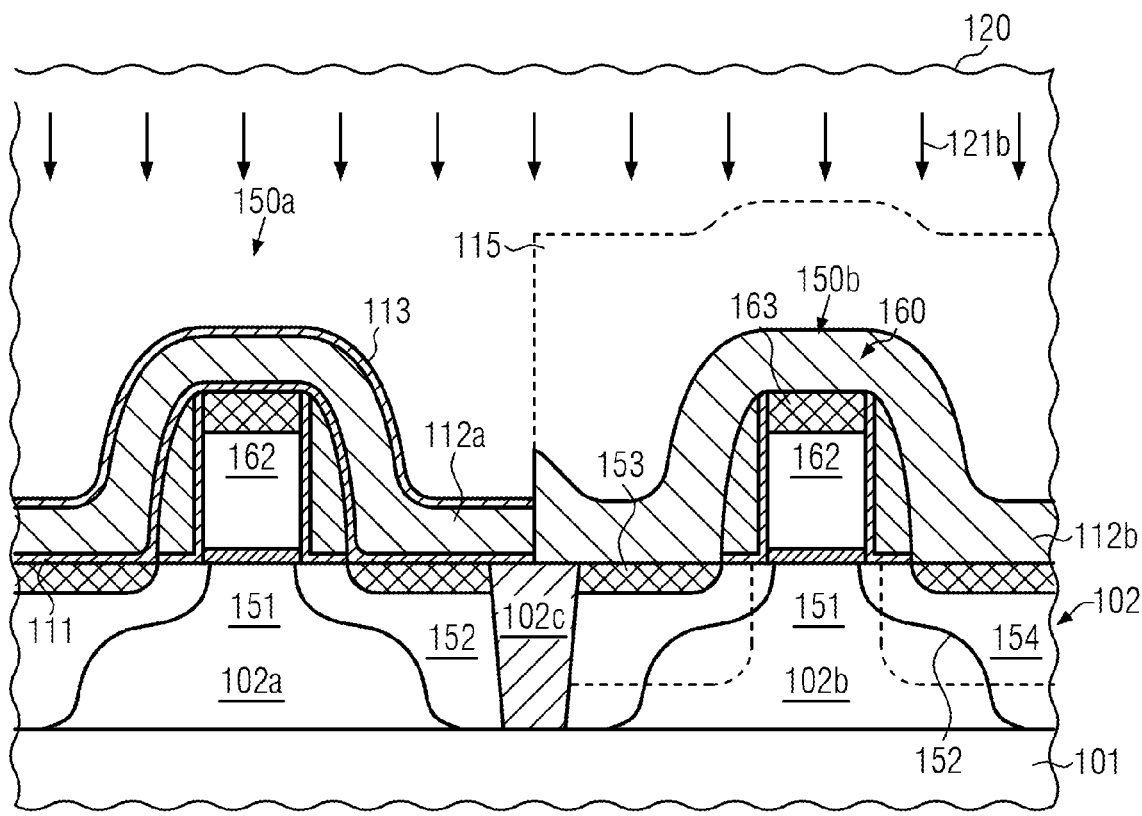

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the present disclosure provides manufacturing techniques in which material deterioration, such as stress relaxation, resistance increase, layer thickness reduction and the like, may be reduced upon patterning a strain-inducing material layer above a transistor by taking into consideration the interaction of fluorine and oxygen radicals during a process sequence for patterning a stressed dielectric material and removing organic residues, such as a resist mask. Without intending to restrict the present application to the following explanation, it is nevertheless believed that basically the application of an oxygen plasma, when applied in the presence of a stressed dielectric material, possibly having formed thereon a thin silicon dioxide material, may result in a significant oxidation and thus stress relaxation. Furthermore, measurement results indicate that the presence of a fluorine species in a corresponding plasma ambient may even further increase the resulting stress relaxation, thereby reducing the efficiency of the stress-inducing mechanism. In addition to or alternatively to these negative impacts, it is believed that the oxygen plasma, in combination with the presence of fluorine species, in particular during the removal of a resist material, may result in significant deterioration of sensitive materials, such as metal silicide materials, when patterning a strain-inducing dielectric material. For example, the fluorine species may result in the breakage of chemical bonds in the metal silicide, thereby forming volatile byproducts, which in turn result in a significant modification of the metal silicide material, which in turn may cause a significant instability of a germanium species in the metal silicide material. Furthermore, due to the interaction with the fluorine species, an increased degree of interaction with the oxygen radicals of an oxygen plasma may take place, thereby also increasing the overall oxidation rate in the metal silicide regions, which in turn may result in a pronounced removal of conductive components in these materials upon performing an additional cleaning process, which may remove any oxides previously created. Consequently, the conventional process sequence performed as an in situ process for etching the silicon nitride material and subsequently removing the resist material with an oxygen plasma in the same etch chamber may thus result in a less pronounced performance gain of transistors.

According to the present disclosure, a plurality of experiments have been performed in order to determine corresponding failure mechanisms and to implement a superior process sequence, for instance by using different process environments, i.e., process chambers, for performing the actual etch process and for removing the resist material and/or by avoiding the supply of oxygen gas at least during the phase when the resist material is removed, while, in other illustrative embodiments, generally the concentration of fluorine on oxygen is reduced in a plasma ambient for removing the resist material compared to a plasma ambient as is used for etching the strain-inducing dielectric material.

With reference to FIGS. 2a-2h, 3a-3c and 4, further illustrative embodiments will now be described in more detail, wherein reference may also be made to FIGS. 1a-1f, if appropriate, for instance in order to not unduly repeat the description of components and process sequences which may also be efficiently used in the illustrative embodiments.

In some illustrative embodiments, appropriate test substrates have been prepared in which a stressed silicon nitride material is formed, for instance by using deposition techniques and subsequent treatments, as discussed above with reference to the device 100, thereby providing samples with tensile stress and samples with compressive stress in the silicon nitride material. Furthermore, a resist mask has been provided so as to cover certain portions of the silicon nitride material while any exposed portions are removed on the basis of appropriate plasma etch recipes, as are also described above. Thereafter, the resist mask is removed on the basis of a further plasma process, wherein different process conditions have been implemented. That is, samples have been prepared as reference, i.e., resist removal has been accomplished by, for instance, wet chemical cleaning recipes without using a plasma; other samples have been prepared on the basis of a process sequence as described above with reference to the device 100, i.e., the actual etch process and the resist ashing process are performed as an in situ process on the basis of an oxygen plasma; moreover, samples provided in which the resist removal process is performed in a separate dedicated process chamber on the basis of an "oxygen-free" plasma, wherein nitrogen, hydrogen, forming gas (mixture of nitrogen and hydrogen gas), ammonia-based gas or helium-based gas with a certain fraction of hydrogen are used as precursor gases for establishing a process ambient.

Figure 2A:
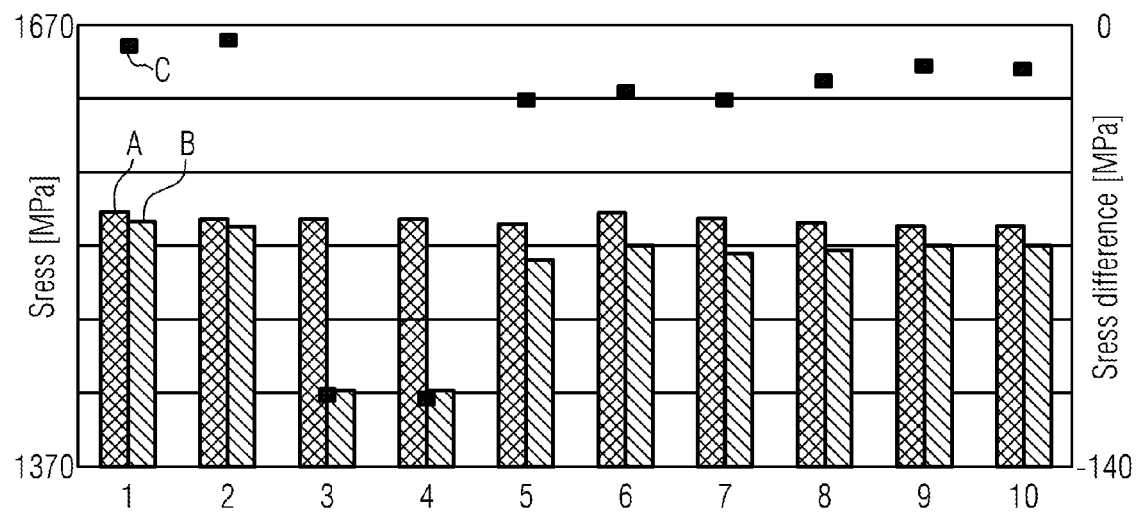
FIGS. 2a-2h are graphical illustrations of experimental data performed so as to estimate the influence of an oxygen plasma and fluorine radicals on various materials of a semiconductor device during the patterning of a strain-inducing material layer, according to illustrative embodiments.

FIG. 2a schematically illustrates the result of measurements of the stress level of various samples upon forming the stressed silicon nitride material (A) and after performing the above-described process sequence (B), while measurement points (C) indicate the change in the internal stress. The horizontal axis of FIG. 2a illustrates the various samples labeled as samples 1-10, while the vertical axis at the left-hand side indicates the internal stress level of the corresponding sample. The vertical axis at the right-hand side indicates the difference of the stress levels of the measurement values A and B, also indicated as stress loss. As shown, samples 1 and 2 correspond to the reference samples, while samples 3 and 4 are to be understood as the conventional samples, i.e., in this case, the resist removal is performed as an in situ process on the basis of an oxygen plasma. The samples 5, 6 and 7, 8 and 9, 10 represent samples prepared on the basis of the concepts of the present disclosure, i.e., in this case without supplying oxygen gas to a plasma ambient for removing the resist mask after patterning the stressed silicon nitride material. It should be appreciated that the samples 5-10 may also represent a process sequence in which the corresponding resist ashing process has been performed in a separate dedicated resist removal etch tool. It should be appreciated, however, that basically the oxygen-free resist removal process as represented by samples 5-10 may also be implemented in the same process chamber as the actual process for patterning the silicon nitride material.

As indicated by the measurement points A, the initial stress level of all of the samples is substantially the same, while, on the other hand, the resulting stress level (B) for samples 3 and 4, i.e., the conventional samples, is significantly reduced. This is also clearly indicated by the measurement points C, which are lowest for the samples 3 and 4. On the other hand, the samples 5 and 6, representing a gas mixture of forming gas and hydrogen and helium, the samples 7 and 8, representing a plasma ambient based on forming gas, and the samples 9 and 10, representing a gas ambient established on the basis of ammonia, may have a relatively high stress level, which is similar to the stress level of the reference samples 1 and 2. Hence, the measurement results of FIG. 2a clearly indicate the negative effect of a plasma oxygen on the stress level of a tensile stressed silicon nitride material.

Figure 2B:
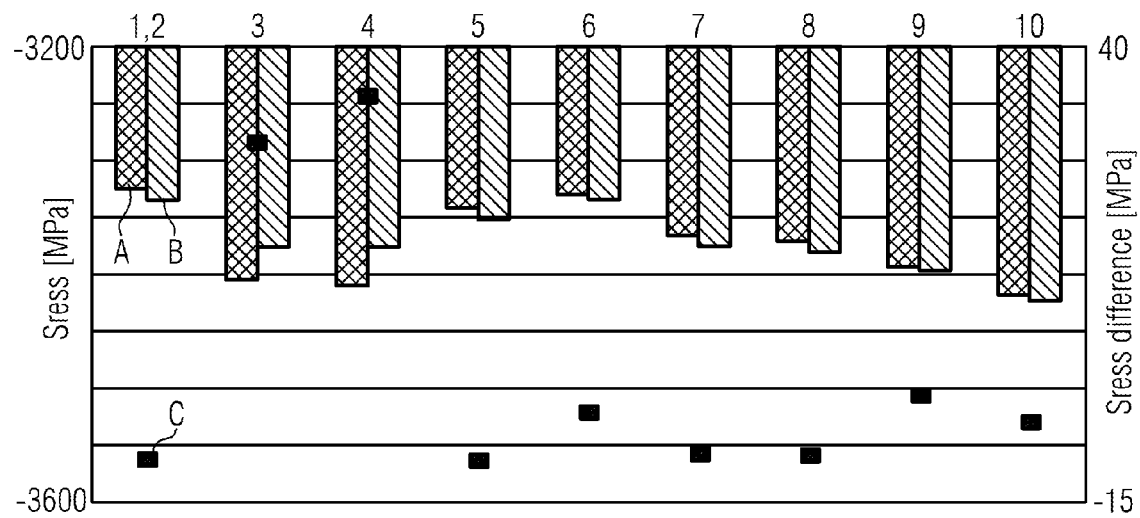

FIG. 2b schematically illustrates measurement results obtained for a compressively stress silicon nitride material, wherein, as in FIG. 2a, the measurement points A represent the stress levels after forming the respective materials, the measurement points B represent the measurement values after the above-described process sequence, and the measurement points C indicate the difference of the values A and B. Also in this case, the samples 3 and 4 have been determined as the samples having the highest stress loss. Hence, the oxygen plasma also negatively affects the compressive stress level of the silicon nitride material.

As discussed above, according to the present disclosure, it has also been contemplated that transistor deterioration may occur upon interaction of other sensitive device materials with fluorine and oxygen species during a resist removal process, wherein, in particular, the metal silicide has been identified as a material suffering from a pronounced degradation. Hence, appropriate test samples have been prepared in which a metal silicide, such as a nickel silicide with a certain amount of platinum, has been provided in a silicon layer on the basis of a process sequence that is similar to the process sequence as described above with reference to the semiconductor device 100. Moreover, an embedded silicon/germanium material has been provided in the samples in order to also assess the influence on sophisticated P-channel transistors in which an additional strain-inducing mechanism is implemented in the form of an embedded silicon/germanium material, as is also described above with reference to the semiconductor device 100.

Figure 2C:
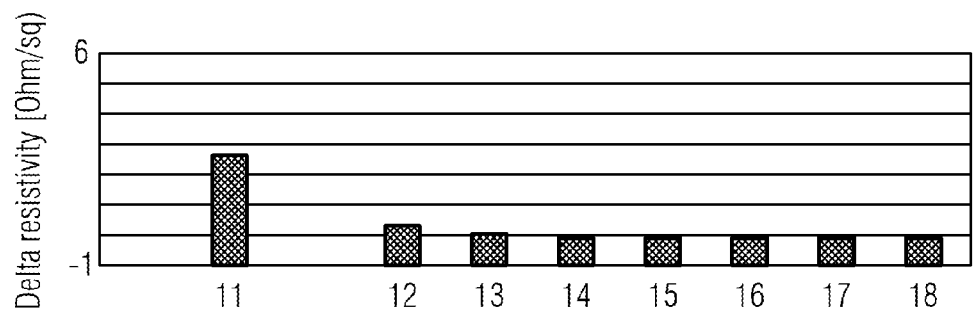

FIG. 2c schematically illustrates a graphical representation of corresponding measurement results with respect to the resistivity of the metal silicide regions that have been processed according to the above-described process sequence. To this end, the sample 11 corresponds to a process sequence in which the resist mask is removed on the basis of an oxygen plasma according to conventional strategy, i.e., an in situ process sequence is applied. Sample 12 corresponds to a process sequence in which an oxygen plasma is applied for removing resist mask, wherein, however, the oxygen plasma is established in a dedicated process chamber, which is substantially free of any fluorine species. That is, a corresponding process chamber may be exclusively used for resist removal processes without performing actual etch processes using fluorine-containing reactive precursor gases, which may result in the creation of fluorine-containing polymers, which may deposit on hardware components of the corresponding etch chamber. Moreover, the samples 13, 14, 15, 16, 17 and 18 represent process sequences in which a plasma ambient is established in a dedicated process chamber without supply of oxygen gas. For example, gases such as the gases as described above may be used, while, in other cases, carbon monoxide, carbon dioxide and the like may be used for establishing the gas ambient for removing the resist mask. For instance, even if oxygen-containing gas components are supplied, such as carbon monoxide or carbon dioxide, the supply of oxygen gas is nevertheless suppressed and, therefore, a reduced material deterioration is observed. That is, as is evident from FIG. 2c, the resistivity, plotted against the vertical axis in FIG. 2c, is highest for the sample 11, while the remaining samples may have similar resistivity values, thereby indicating a significantly reduced degradation of the conductivity of the metal silicide material. In other words, the electrical conductivity of the metal silicide becomes higher by using an external strip process, as indicated by the resistivity values of the samples 12-18.

Figure 2D:
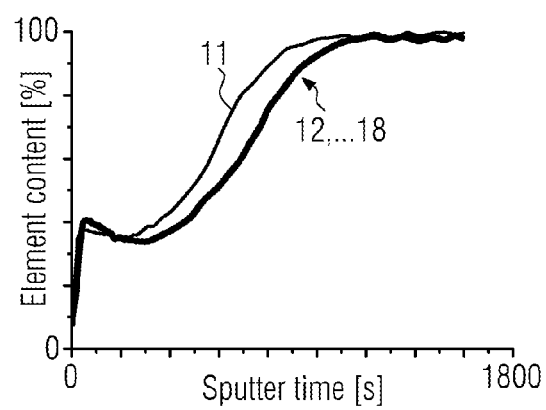

FIG. 2d schematically illustrates measurement results obtained by x-ray photoelectron spectroscopy. Thus, the horizontal axis in FIG. 2d represents the sputter time in seconds, while the vertical axis indicates the fraction of a corresponding element in percent. In the case of FIG. 2d, the elementary silicon has been measured for the various samples 11-18. As is evident from this figure, the fraction of silicon raises earlier for sample 11 (conventional in situ resist strip) compared to the remaining samples 12-18, thereby indicating a reduced thickness of the metal silicide material of sample 11.

Figure 2E:
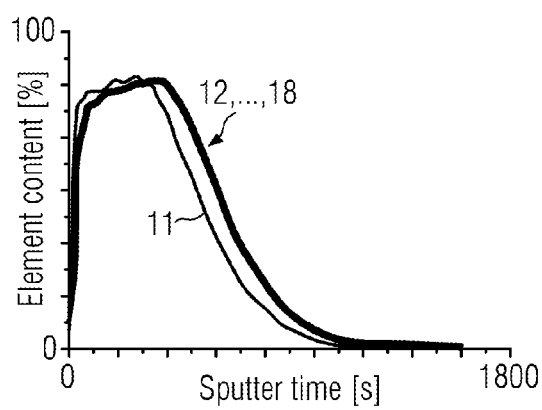

FIG. 2e schematically illustrates the corresponding measurement results with respect to nickel. As is evident, the concentration of nickel begins to drop significantly earlier for sample 11 compared to the remaining samples 12-18. That is, this also indicates that the nickel silicide is of reduced thickness in the sample 11 of the in situ oxygen plasma strip process since typically a fluorine species is present in the oxygen plasma due to the preceding fluorine-based plasma etch process, as is also explained above.

Figure 2F:
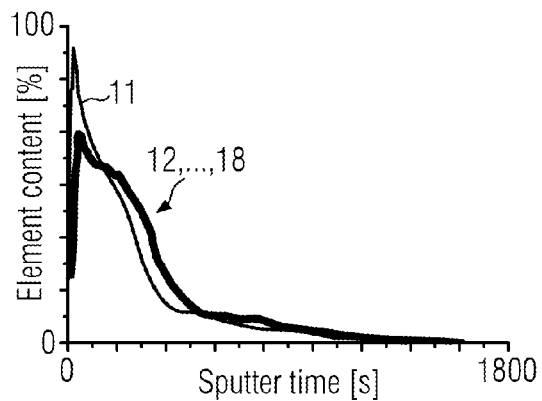

FIG. 2f represents the measurement results for platinum, thereby also indicating that the curve starts to drop earlier for sample 11 compared to the remaining ex situ samples 12-18. Thus, this also indicates a reduction of the silicide thickness, which may be caused by the fluorine species in the oxygen plasma during the in situ strip process. The fluorine species in the process environment is able to break the silicide bonds of nickel-platinum-silicon. The open bonds react with oxygen to an oxide such as nickel oxide, platinum oxide and silicon oxide. During a subsequent cleaning process, for instance on the basis of SPM/APM (mixture of sulfuric acid and hydrogen peroxide/mixture of ammonium hydroxide and hydrogen peroxide), the previously built oxide material may be partially or completely removed, thereby reducing the thickness of the entire silicide material, as is, for instance, indicated by the above-described measurement results.

As previously explained with reference to the device 100, frequently a thin silicon dioxide etch stop layer, such as the layer 111 (FIG. 1a), is provided so as to reduce the influence of the resulting patterning process on the sensitive metal silicide material. The degree of protection is also significantly differently affected, depending on whether an in situ oxygen plasma process is applied or the presence of fluorine species during the resist removal process is suppressed.

Figure 2G:
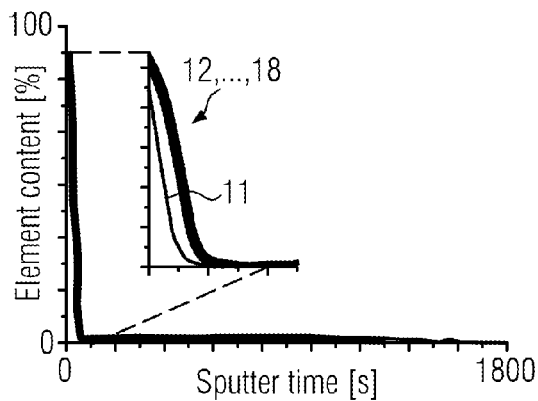

FIG. 2g schematically illustrates measurement results wherein the presence of oxygen at the surface of the samples is measured, wherein also the curve of sample 11 drops significantly earlier compared to the remaining ex situ samples 12-18. A similar result would be obtained for detecting silicon oxide material, thereby clearly indicating a significantly reduced thickness of the protective oxide passivation film, if provided.

As discussed above, frequently, a strain-inducing silicon/germanium material is embedded in the active region of the P-channel transistor, which may thus also be influenced by the patterning sequence for forming a stressed dielectric material.

Figure 2H:
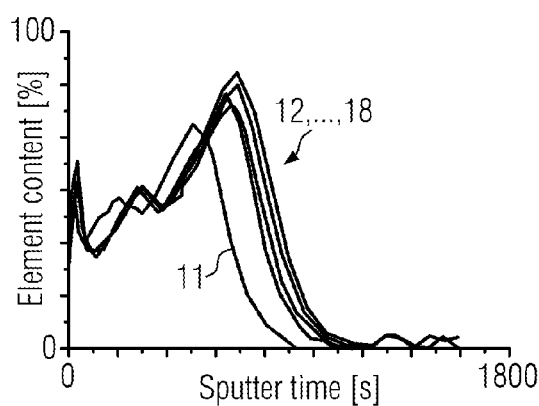

FIG. 2h schematically illustrates the measurement results with respect to germanium species, which also indicates that, for sample 11, generally a reduced thickness and thus amount of the germanium species is measured compared to the ex situ samples 12-18.

As a result, the measurements obtained from the test samples indicate that generally an oxygen plasma may have a detrimental effect on the finally obtained internal stress level of the silicon nitride material, which may be addressed by avoiding the supply of oxygen gas for establishing a plasma ambient, which is used to remove a resist material after the patterning of the strain-inducing dielectric material. To this end, appropriate precursor gases, as discussed above, may be used instead of pure oxygen gas. Furthermore, there is an indication that the presence of a fluorine species in combination with an oxygen plasma may even further affect degradation of the internal stress level so that, in some illustrative embodiments, a plasma ambient may be established by avoiding supply of an oxygen gas to the process environment upon removing the resist material, while at the same time using a dedicated process chamber or process environment, in which a fluorine-depleted ambient is ensured. For example, by using dedicated process chambers for resist hash processes only, the formation of fluorine-containing polymers may be significantly suppressed and thus the generation of a volatile fluorine species upon establishing a further plasma ambient may be significantly suppressed. For example, in using "oxygen-depleted" precursor gases compared to pure oxygen, such as carbon monoxide, carbon dioxide and the like, it is advantageous to perform an ex situ process in which the resist removal process may be performed in a process chamber that may not be contacted with fluorine-containing precursor materials in order to reduce the fluorine and oxygen concentration compared to conventional strategies.

Moreover, the above measurement results indicate that the presence of fluorine species in an oxygen plasma may also significantly affect sensitive materials, such as a metal silicide, even if a thin silicon dioxide passivation layer may be provided. Hence, in some illustrative embodiments, the patterning of a strain-inducing dielectric material layer formed above a metal silicide material, which may possibly include a strain-inducing semiconductor material, may be performed as an in situ process by avoiding the supply of oxygen gas and using substantially oxygen-free precursor gases. Furthermore, in some illustrative embodiments, the process sequence may be advantageously performed as an ex situ process sequence in which the patterning of the strain-inducing dielectric material may be accomplished in a first process environment, while the resist removal is accomplished in a second different process environment without being in contact with a fluorine-containing precursor gas.

Figure 3A:
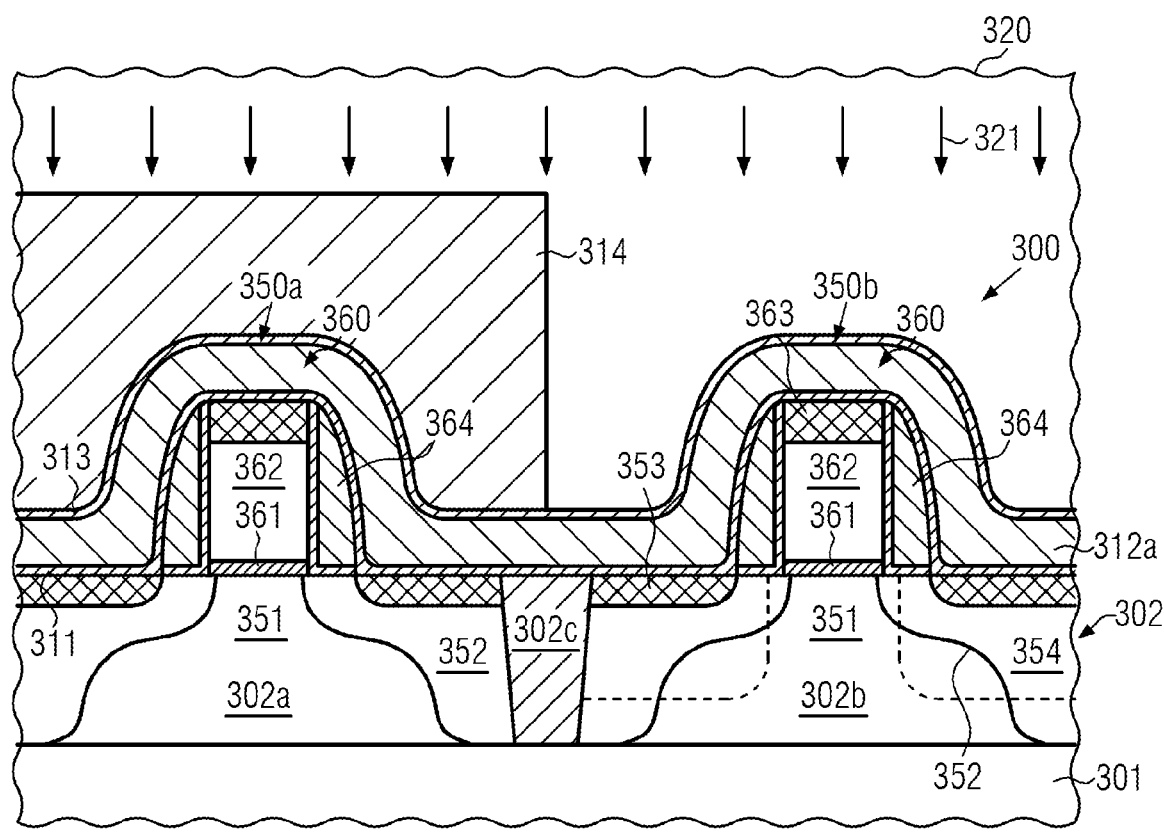
FIGS. 3a-3c schematically illustrate cross-sectional views of a semiconductor device during various manufacturing stages in which a strain-inducing material layer is patterned on the basis of a superior etch and resist removal sequence so as to avoid or at least significantly reduce material deterioration, according to illustrative embodiments.
Figure 3B:
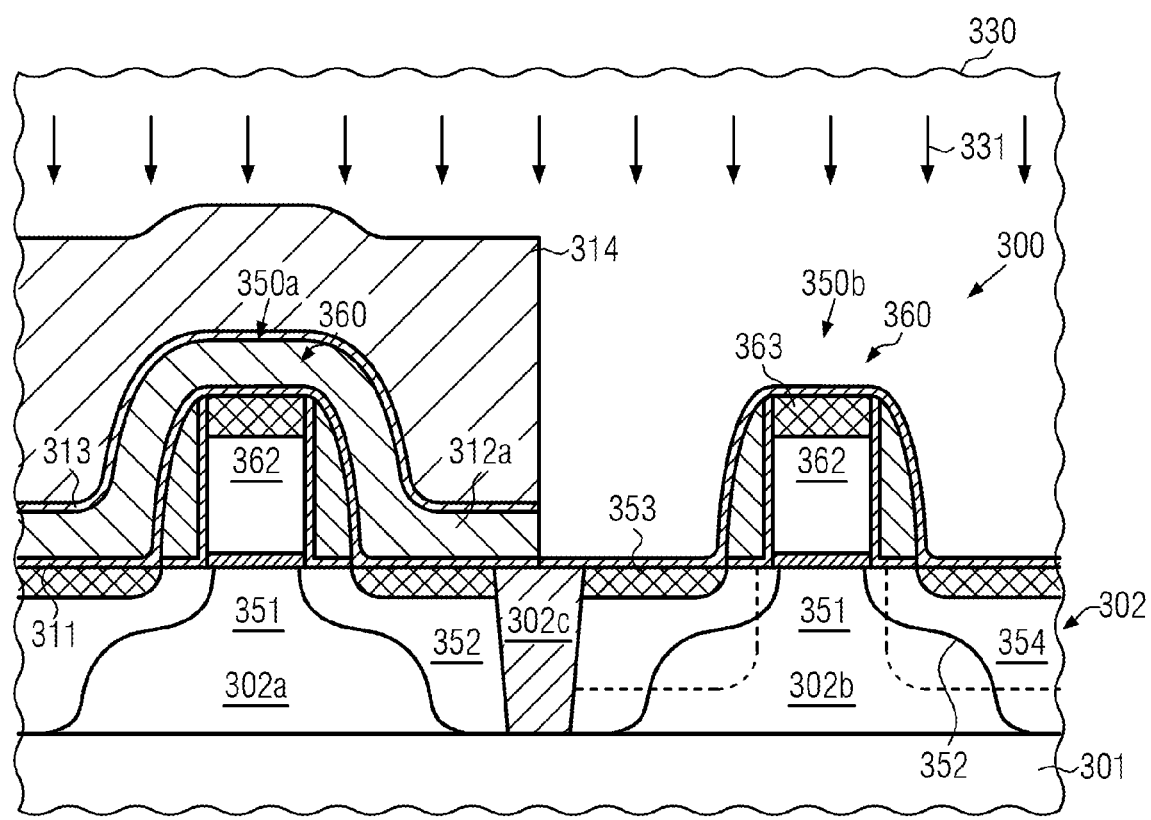
Figure 3C:
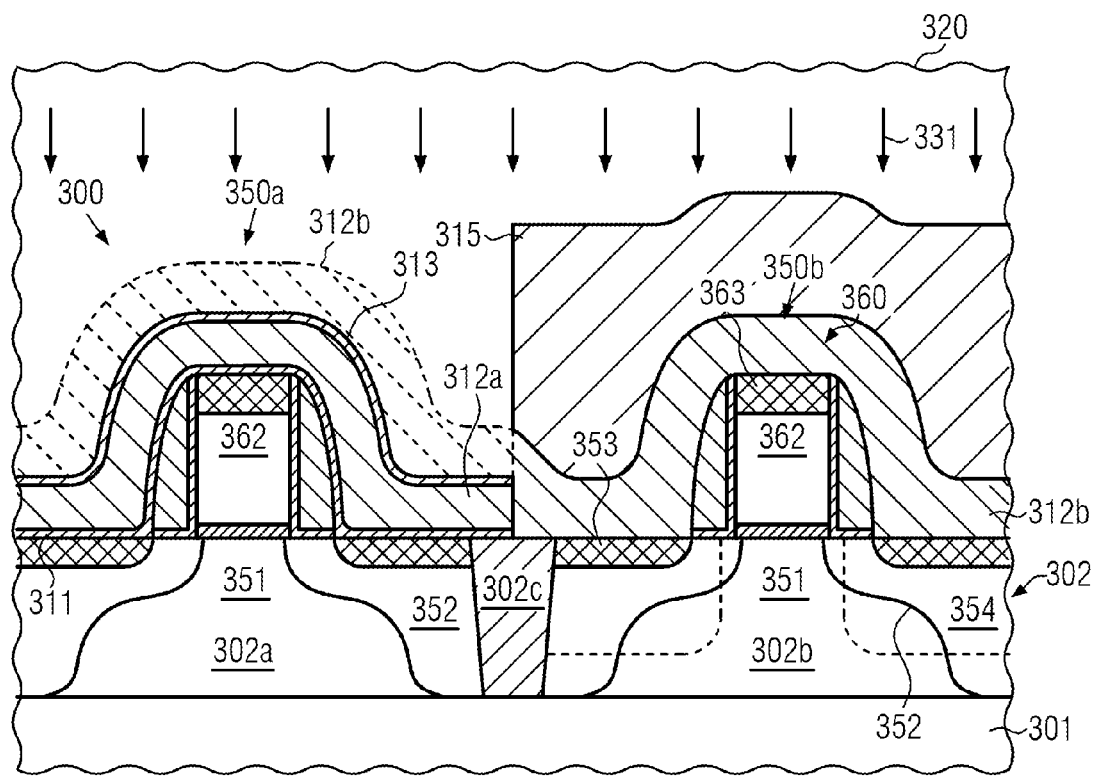

With reference to FIGS. 3a-3c and also referring to FIGS. 1a-1f when necessary, further illustrative embodiments will now be described in more detail.

FIG. 3a schematically illustrates a cross-sectional view of a semiconductor device 300 comprising a substrate 301 in combination with a semiconductor layer 302 in which a plurality of active regions are formed, such as active regions 302a, 302b. As discussed above, the active regions may be divided by appropriately forming an isolation region 302c. A first transistor 350a is formed in and above the active region 302a and may, for instance, represent an N-channel transistor, while a second transistor 350b may be formed in and above the active region 302b and may represent a P-channel transistor. The transistors 350a, 350b may have basically the same configuration as the transistors previously described with respect to the semiconductor device 100, i.e., these transistors may comprise a gate electrode structure 360 including a gate dielectric material 361, a semiconductor electrode material 362 and a metal silicide 363. Furthermore, an appropriate spacer structure 364 may be provided so as to define appropriate sidewalls of the gate electrode structures 360. Similarly, drain and source regions 352 may be provided in the active regions 302a, 302b and metal silicide regions 353 may be formed therein. Furthermore, in the embodiment shown, an optional strain-inducing semiconductor material 354, such as a silicon/germanium material, may be formed in one or both of the active regions 302a, 302b. In the embodiment shown, the material 354 is selectively provided in the active region 302b in order to induce a desired strain in a channel region 351.

With respect to a process strategy for forming the transistors 350a, 350b, the same criteria may apply as previously explained with reference to the semiconductor device 100. Moreover, in this manufacturing stage, a strain-inducing dielectric material layer 312a, such as a silicon nitride material having, for instance, a tensile stress, may be formed above the transistors 350a, 350b, wherein an optional etch stop layer 311 may be positioned below the material 312a. Moreover, if required, an etch control layer 313 may be formed on the material layer 312a, as is also previously explained. In the example shown, it is assumed that the internal stress level of the material 312a is inappropriate for the transistor 350b and, thus, a resist mask 314 may be provided so as to expose the transistor 350b in order to enable the removal of the material 312a on the basis of an appropriate plasma assisted etch process 321, which is performed in a first process environment 320.

It should be appreciated that the materials 311, 312a and 313 as well as the resist mask 314 may be formed on the basis of process strategies as are also discussed above with reference to the semiconductor device 100. Similarly, the plasma-based etch process 321 may be performed on the basis of process recipes as are also described above. Typically, during the process 321, a fluorine species may be used in the process environment 320, which may result in the formation of a carbon and fluorine-containing polymer species, which may thus deposit on hardware components, such as chamber walls and the like. Consequently, during the etch process 321, the material 312a may be efficiently removed after etching through the layer 313, if provided, wherein finally the material 311, if provided, may provide certain etch stop capabilities, depending on the initial thickness of the layer 311.

FIG. 3b schematically illustrates the device 300 in a further advanced manufacturing stage. As shown, the device 300 is positioned in a second process environment 330, such as a dedicated plasma process tool, in order to perform a plasma process 331 so as to remove the remaining portion of the mask 314 and other polymer residues, as is also discussed above. In illustrative embodiments, the second process environment 330 is a dedicated process tool in which a previous creation of fluorine-containing polymers has been avoided, for instance, by specifically using the environment 330 for resist ashing processes and the like, so that the presence of fluorine species during the plasma process 331 may be significantly reduced compared to conventional process strategies. In some illustrative embodiments, the plasma ambient in the environment 330 may be established on the basis of a substantially oxygen-free precursor gas, for instance, by using one or more of the above-identified gases in the form of hydrogen, nitrogen, ammonia-based gases and the like. In other cases, the plasma ambient is established by avoiding the supply of an oxygen gas, thereby also achieving a reduced fluorine and oxygen concentration during the process 331 compared to conventional strategies and also compared to the etch process 321 that is performed in the environment 320 (FIG. 3a). For example, the process 331 may be performed on the basis of oxygen-containing gases, such as carbon monoxide, carbon dioxide, which are to be understood as "oxygen-depleted" gases compared to pure oxygen gas. Hence, as explained above, during the removal of the remaining resist mask 314, presence of fluorine species and oxygen species may be significantly reduced compared to conventional strategies, thereby also avoiding undue interaction with the material 312a, which may conventionally result in a certain reduction of the internal stress level, even if the material 313 is provided. Furthermore, as also described above with reference to the various measurement results, undue interaction of the plasma ambient 331 with the sensitive material 353 and also the material 363 may be reduced compared to conventional strategies, thereby avoiding increase of resistivity due to material loss and reduction in thickness of the layers 353, 363, while also instability of a germanium species in the material 353 may be avoided if the strain-inducing semiconductor material 354 is implemented in the active region 302b. Moreover, integrity of the layer 311, if provided, is affected to a lesser degree compared to conventional strategies, thereby also providing superior robustness during a subsequent cleaning process in which additional contaminants and possibly also the material layer 311 may be removed. Hence, upon applying the plasma resist removal process 331 on the basis of the concepts as set forth above, superior material characteristics in the regions 353 and 363 may be achieved compared to the conventional strategies.

FIG. 3c schematically illustrates the semiconductor device 300 according to further illustrative embodiments in which a further strain-inducing material 312b may be formed above the transistors 350a, 350b according to a dual stress liner approach. The material 312b may be formed on the basis of process techniques as are also described above with reference to the device 100. Furthermore, the device 300 may be processed in a process environment for performing a plasma-based etch process so as to remove an exposed portion of the layer 312b, while the remaining portion of the layer 312b may be covered by a resist mask 315. To this end, a similar process environment may be used as is also described above with reference to the environment 320 when performing the etch process 321 (FIG. 3a). It should be appreciated, however, that any other process environment may be used, depending on the tool resources in the specific manufacturing site. Thereafter, the device 300 may be processed in a further process environment in order to remove the remaining portion of the resist mask 315 after the removal of the exposed portion of the layer 312b. To this end, similar process conditions may be established as previously described with reference to the environment 330 and the plasma-based resist removal process 331 of FIG. 3b. For example, the same process environment and the same process recipe may be applied, while, in other cases, a different process environment and a modified process recipe may be applied, as long as a desired reduced interaction with exposed strain-inducing dielectric materials may be ensured. Consequently, reduction of the internal stress level of the layer 312b above the transistor 350b may be significantly reduced compared to conventional processes, and a significant influence on the layer 312a may also be avoided.

Thereafter, the further processing may be continued by completing the contact level, as is also discussed above with reference to the semiconductor device 100.

Consequently, upon processing the device 300, undue contact of the strain-inducing materials 312a, 312b to a fluorine and oxygen-containing plasma ambient may be avoided, thereby significantly reducing a corresponding reduction of the internal stress level, while also interaction of the fluorine and oxygen-containing plasma ambient with sensitive materials, such as the materials 353 and 363, may be suppressed. Hence, overall performance of the transistors 300 may be enhanced due to a reduced reduction of the internal stress level of the materials 312a and/or 312b and by avoiding undue material deterioration of materials 353 and 354. For example, a significant enhancement of performance of the P-channel transistor 350b may be observed upon determining the resulting drive current capabilities, wherein the corresponding gain in performance is associated with an increased internal stress level of the material 312b in combination with an overall reduced series resistance due to a lesser material degradation in the drain and source regions of the transistor 350b. Moreover, upon completing the semiconductor device, a reduced contact resistivity may also be observed, which is also associated with a reduced material degradation, in particular during the patterning of the layer 312a.

Figure 4:
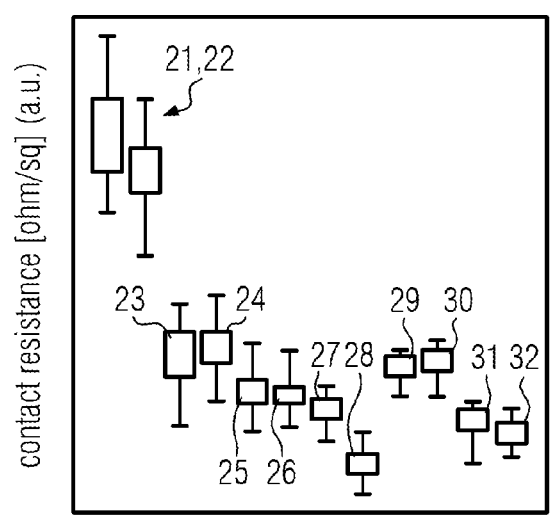
FIG. 4 schematically illustrates measurement results indicating performance improvements compared to conventional dual stress liner approaches when applying illustrative embodiments of the present disclosure.

FIG. 4 schematically illustrates measurement results of the contact resistance for transistors such as the P-channel transistor 350b when formed in accordance with the process strategies as described above. For example, the samples 23-32 correspond to various variants in performing the resist removal process 331 (FIGS. 3b, 3c) with reduced fluorine and oxygen concentration, as discussed above, while samples 21, 22 correspond to conventionally fabricated transistors with otherwise identical transistor configuration. As is clearly evident, the samples processed in accordance with the present invention provide superior contact resistivity.

As a result, the present disclosure provides manufacturing techniques in which material deterioration of strain-inducing dielectric layers formed above transistors and/or of metal silicide materials may be reduced during the patterning of the strain-inducing dielectric material layer by taking into consideration the negative effect of a fluorine species in an oxygen plasma that may conventionally be used for removing the resist material.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    forming a first strain-inducing dielectric layer above a first transistor and a second transistor of a semiconductor device;
    selectively removing a portion of said first strain-inducing layer from above said second transistor by covering said first transistor with a resist mask and performing a first plasma assisted etch process in a first processing chamber using a first process environment;
    moving said semiconductor device from said first processing chamber to a second processing chamber;
    removing said resist mask by performing a second plasma assisted process in said second processing chamber using a second process environment that is different from said first process environment;
    forming a second strain-inducing dielectric layer above said first transistor and said second transistor;
    selectively removing said second strain-inducing dielectric layer from above said first transistor in a third process environment by using a resist mask formed above said second transistor; and
    removing said resist mask in a fourth process environment that is different from said first and third process environments.

2. The method of claim 1, wherein said first plasma assisted etch process is performed by establishing a plasma so as to include at least fluorine and oxygen.

3. The method of claim 1, wherein a plasma of said second plasma assisted process is established by avoiding supply of oxygen gas.

4. The method of claim 3, wherein a plasma of said second plasma assisted process is established by supplying at least one of nitrogen gas, hydrogen gas, helium gas, ammonia gas and carbon oxide gas.

5. The method of claim 1, further comprising forming a metal silicide in drain and source regions of said first and second transistors prior to forming said first strain-inducing dielectric layer.

6. The method of claim 1, further comprising forming a strain-inducing semiconductor material in an active region of at least said second transistor prior to forming said first strain-inducing dielectric layer.

7. The method of claim 1, wherein a plasma in said fourth process environment is established by avoiding supply of oxygen gas.

8. The method of claim 7, wherein a plasma in said fourth process environment is established by supplying at least one of nitrogen gas, hydrogen gas, helium gas, ammonia gas and carbon oxide gas.

9. A method, comprising:
forming a first strain-inducing dielectric layer above a first transistor and a second transistor;
forming a resist mask above said first transistor so as to expose a portion of said first strain-inducing dielectric layer selectively above said second transistor;
removing said exposed portion of said first strain-inducing dielectric layer in a first plasma ambient in the presence of said resist mask, wherein said first plasma ambient is established in a first process environment; and
removing said resist mask in a second plasma ambient without supplying oxygen gas to said second plasma ambient, wherein said second plasma ambient is established in a second process environment that differs from said first process environment.

10. The method of claim 9, wherein said second process environment is a process environment used for fluorine-free plasma processes.

11. The method of claim 9, wherein said second plasma ambient is established by supplying at least one of nitrogen gas, hydrogen gas, helium gas, ammonia gas and carbon oxide gas.

12. The method of claim 9, wherein said second plasma ambient is established substantially without generating a bias voltage.

13. The method of claim 9, further comprising forming a second strain-inducing layer above said second transistor, wherein said second strain-inducing dielectric layer induces a different type of strain compared to said first strain-inducing dielectric layer.

14. The method of claim 13, wherein forming said second strain-inducing dielectric layer comprises forming said second strain-inducing dielectric layer above said first transistor and said second transistor, selectively removing said second strain-inducing dielectric layer from above said first transistor in a third plasma ambient by using a further resist mask formed above said second transistor and removing said further resist mask in a fourth plasma ambient.

15. The method of claim 14, wherein said third and fourth plasma ambients are established in the same process environment without supplying an oxygen gas when establishing said fourth plasma ambient.

16. The method of claim 14, wherein said third and fourth plasma ambients are established in different process environments.

17. A method, comprising:
forming a first transistor in and above a first active region;
forming a second transistor in and above a second active region, said second active region comprising a strain-inducing semiconductor alloy;
forming a strain-inducing layer above said first and second transistors;
forming a resist mask so as to cover said strain-inducing layer above said first transistor and expose said strain-inducing layer above said second transistor;
removing an exposed portion of said strain-inducing layer in a first process chamber by using a first plasma ambient based on fluorine radicals; and
removing said resist mask in a second process chamber by using a second plasma ambient that is established so as to have a reduced fluorine and oxygen concentration compared to said first plasma ambient.

18. The method of claim 17, wherein establishing said second plasma ambient comprises suppressing supply of oxygen gas.

19. The method of claim 17, wherein establishing said second plasma ambient comprises using a fluorine-depleted process environment so as to avoid release of fluorine radicals in said second plasma ambient.

20. The method of claim 17, further comprising forming a metal silicide in said first and second active regions prior to forming said strain-inducing layer.

21. The method of claim 1, wherein selectively removing said portion of said first strain-inducing layer from above said second transistor comprises performing said first plasma assisted etch process in a first process chamber and wherein removing said resist mask comprises moving a semiconductor device comprising said first and second transistors from said first process chamber to a second process chamber and removing said resist mask by performing said second plasma assisted process in said second process chamber.

22. The method of claim 9, wherein removing said exposed portion of said first strain-inducing dielectric layer comprises establishing said first plasma ambient in a first process chamber and removing said exposed portion in said first process chamber and wherein removing said resist mask comprises establishing said second plasma ambient in a second process chamber and removing said resist mask in said second process chamber.

23. A method, comprising:
forming a first strain-inducing dielectric layer above a first transistor and a second transistor;
selectively removing a portion of said first strain-inducing layer from above said second transistor by covering said first transistor with a first resist mask and performing a first plasma assisted etch process in a first process environment;
removing said first resist mask by performing a second plasma assisted process in a second process environment that is different from said first process environment;
forming a second strain-inducing dielectric layer above said first transistor and said second transistor, wherein said second strain-inducing dielectric layer induces a different type of strain compared to said first strain-inducing dielectric layer;
selectively removing said second strain-inducing dielectric layer from above said first transistor in a third process environment by using a second resist mask formed above said second transistor; and
removing said second resist mask in a fourth process environment that is different from said first and third process environments.

24. A method, comprising:
forming a first strain-inducing dielectric layer above a first transistor and a second transistor;
forming a resist mask above said first transistor so as to expose a portion of said first strain-inducing dielectric layer selectively above said second transistor;

establishing a first plasma ambient in a process environment;

removing said exposed portion of said first strain-inducing dielectric layer in said first plasma ambient established in said process environment in the presence of said resist mask;

establishing a second plasma ambient in said process environment substantially without generating a bias voltage; and removing said resist mask in said second plasma ambient established in said process environment without supplying oxygen gas to said second plasma ambient.

* * * * *